United States Patent
Fujimoto et al.

(10) Patent No.: US 8,754,431 B2
(45) Date of Patent: Jun. 17, 2014

(54) LIGHT EMITTING DEVICE WITH AN ELECTRODE HAVING A THROUGH-HOLES

(75) Inventors: Akira Fujimoto, Kanagawa-ken (JP); Tsutomu Nakanishi, Tokyo (JP); Ryota Kitagawa, Tokyo (JP); Kenji Nakamura, Kanagawa-ken (JP); Shinji Nunotani, Fukuoka-ken (JP); Takanobu Kamakura, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 290 days.

(21) Appl. No.: 13/412,044

(22) Filed: Mar. 5, 2012

(65) Prior Publication Data
US 2013/0075771 A1 Mar. 28, 2013

(30) Foreign Application Priority Data
Sep. 24, 2011 (JP) ................................. 2011-208279

(51) Int. Cl.
H01L 33/00 (2010.01)
H01L 33/38 (2010.01)
H01L 33/30 (2010.01)
H01L 33/10 (2010.01)

(52) U.S. Cl.
CPC .............. *H01L 33/38* (2013.01); *H01L 33/30* (2013.01); *H04L 33/405* (2013.01); *H01L 33/10* (2013.01)
USPC ....... 257/98; 257/432; 257/448; 257/E33.027

(58) Field of Classification Search
CPC ......... H01L 33/10; H01L 33/30; H01L 33/38; H01L 33/405
USPC .................. 257/91, 94–96, 98, 431, 432, 448
See application file for complete search history.

(56) References Cited

U.S. PATENT DOCUMENTS

| 6,784,462 | B2 | 8/2004 | Schubert | |
|---|---|---|---|---|
| 8,283,690 | B2 * | 10/2012 | Cho et al. | 257/98 |
| 8,592,847 | B2 * | 11/2013 | Chen et al. | 257/98 |
| 2010/0117109 | A1 * | 5/2010 | Unno | 257/98 |

(Continued)

FOREIGN PATENT DOCUMENTS

JP 2009-76361 4/2009

OTHER PUBLICATIONS

U.S. Appl. No. 13/221,326, filed Aug. 30, 2011.
U.S. Appl. No. 13/221,319, filed Aug. 30, 2011.

(Continued)

*Primary Examiner* — Alonzo Chambliss
(74) *Attorney, Agent, or Firm* — Finnegan, Henderson, Farabow, Garrett & Dunner, L.L.P.

(57) ABSTRACT

According to one embodiment, a semiconductor light emitting device includes first and second electrode layers, a and second semiconductor layers, a light emitting layer and a first intermediate layer. The first electrode layer has a metal portion having through-holes. The second electrode layer is stacked with the first electrode layer along a stacked direction, and light-reflective. The first semiconductor layer is provided between the first and second electrode layers, and has a first conductivity type. The second semiconductor layer is provided between the first semiconductor layer and the second electrode layer, and has a second conductivity type. The light emitting layer is provided between the first and second semiconductor layers. The first intermediate layer is provided between the second semiconductor layer and the second electrode layer, transmissive to light emitted from the light emitting layer, and includes first contact portions and a first non-contact portion.

20 Claims, 4 Drawing Sheets

(56) References Cited

U.S. PATENT DOCUMENTS

| | | |
|---|---|---|
| 2011/0049556 A1 | 3/2011 | Fujimoto et al. |
| 2011/0220936 A1 | 9/2011 | Fujimoto et al. |
| 2012/0049224 A1* | 3/2012 | Mizutani et al. ............. 257/98 |
| 2012/0056155 A1 | 3/2012 | Asakawa et al. |
| 2012/0056222 A1 | 3/2012 | Kitagawa et al. |
| 2012/0056232 A1 | 3/2012 | Fujimoto et al. |
| 2012/0061640 A1 | 3/2012 | Kitagawa et al. |
| 2012/0061712 A1 | 3/2012 | Masunaga et al. |
| 2012/0132948 A1 | 5/2012 | Nunotani et al. |
| 2012/0228654 A1* | 9/2012 | Fujimoto et al. ............. 257/98 |

OTHER PUBLICATIONS

U.S. Appl. No. 13/222,281, filed Aug. 31, 2011.

* cited by examiner

LIGHT EMITTING DEVICE WITH AN ELECTRODE HAVING A THROUGH-HOLES

CROSS-REFERENCE TO RELATED APPLICATIONS

This application is based upon and claims the benefit of priority from the prior Japanese Patent Application No. 2011-208279, filed on Sep. 24, 2011; the entire contents of which are incorporated herein by reference.

FIELD

Embodiments described herein relate generally to a semiconductor light emitting device.

BACKGROUND

It is desirable for semiconductor light emitting devices such as LEDs (Light Emitting Diodes) and the like to have both high luminance and a low forward voltage. There exists a thin-film LED having a configuration to obtain high luminance by providing an electrode in a dot configuration to increase the current density. However, there is room for improvement to obtain high luminance and a low forward voltage.

DETAILED DESCRIPTION

Figure 1A:
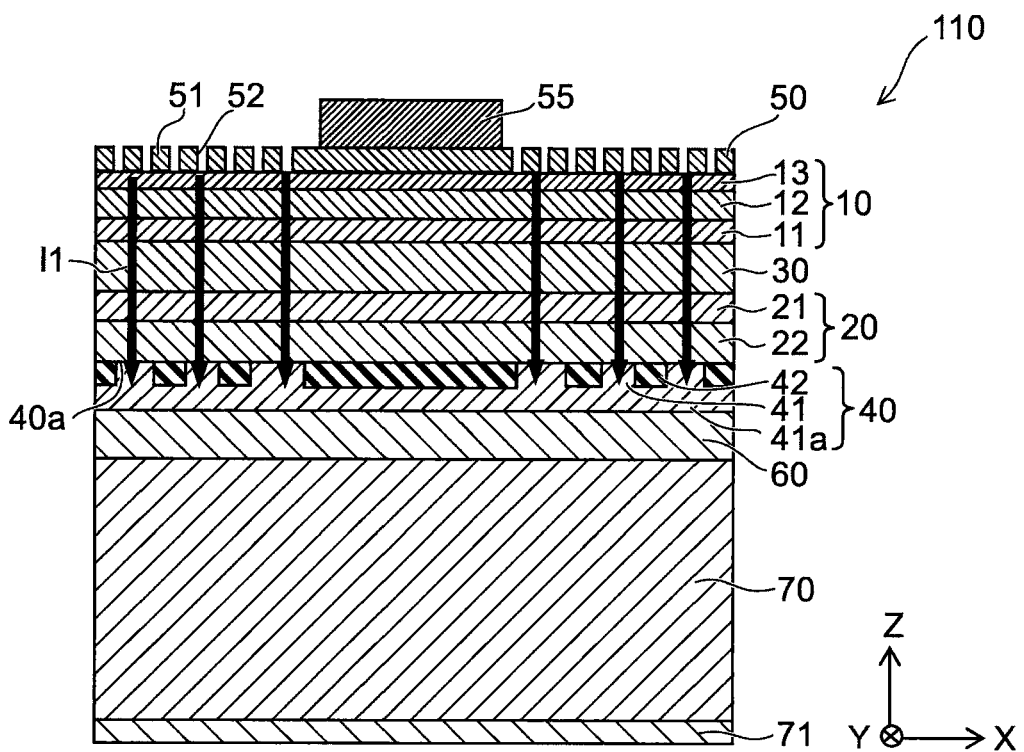
FIG. 1A and FIG. 1B are schematic views illustrating a semiconductor light emitting device according to a first embodiment.

According to one embodiment, a semiconductor light emitting device includes a first electrode layer, a second electrode layer, a first semiconductor layer, a second semiconductor layer, a light emitting layer and a first intermediate layer. The first electrode layer has a metal portion. A plurality of through-holes are provided in the metal portion. Each of the through-holes has an opening having an equivalent circular diameter not less than 10 nanometers and not more than 5 micrometers. The second electrode layer is stacked with the first electrode layer along a stacked direction, and light-reflective. The first semiconductor layer is provided between the first electrode layer and the second electrode layer, and has a first conductivity type. The second semiconductor layer is provided between the first semiconductor layer and the second electrode layer, and has a second conductivity type different from the first conductivity type. The light emitting layer is provided between the first semiconductor layer and the second semiconductor layer. The first intermediate layer is provided between the second semiconductor layer and the second electrode layer. The first intermediate layer is transmissive with respect to light emitted from the light emitting layer. The first intermediate layer includes a plurality of first contact portions and a first non-contact portion. The first contact portions provide electrical contact having a first electrical resistance between the second electrode layer and the second semiconductor layer. The first non-contact portion is juxtaposed with the first contact portions in a first plane perpendicular to the stacking direction to provide a second electrical resistance between the second electrode layer and the second semiconductor layer second electrical resistance. The second electrical resistance is higher than the first electrical resistance.

Embodiments will be described hereinafter with reference to the accompanying drawings.

The drawings are schematic or conceptual; and the proportions of sizes between portions and the like are not necessarily the same as the actual values thereof. The dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

Figure 1B:
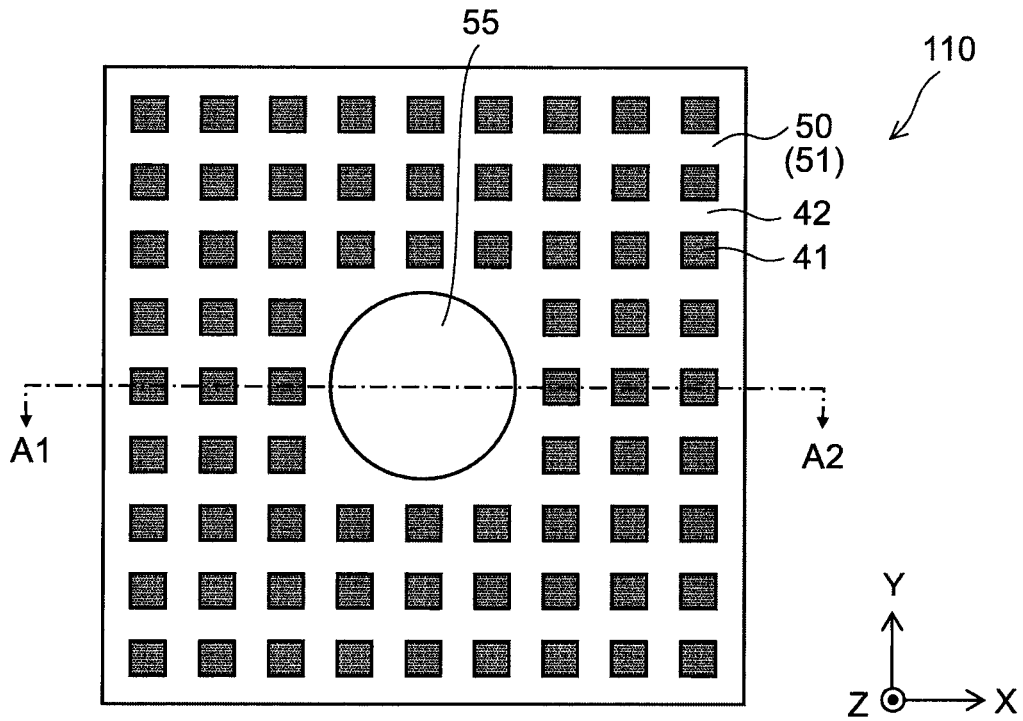

FIG. 1A and FIG. 1B are schematic views illustrating the configuration of a semiconductor light emitting device according to a first embodiment.

FIG. 1B is a perspective plan view. FIG. 1A is a cross-sectional view along line A1-A2 of FIG. 1B.

As illustrated in FIG. 1A and FIG. 1B, the semiconductor light emitting device 110 according to the embodiment includes a first electrode layer 50, a second electrode layer 60, a first semiconductor layer 10, a second semiconductor layer 20, a light emitting layer 30, and a first intermediate layer 40.

The first electrode layer 50 has a metal portion 51. Multiple through-holes 52 are provided in the metal portion 51. An example of the first electrode layer 50 is described below. The through-holes 52 are omitted from FIG. 1B for easier viewing of the drawing.

The second electrode layer 60 is stacked with the first electrode layer 50. In the specification of the application, stacking includes not only the case of being overlaid in direct contact but also the case of being overlaid with another component inserted therebetween.

The second electrode layer 60 is light-reflective. The second electrode layer 60 is reflective with respect to the light emitted from the light emitting layer 30.

Herein, the direction from the second electrode layer 60 toward the first electrode layer 50 is taken as a stacking direction. The stacking direction is taken as a Z-axis direction. One direction perpendicular to the Z-axis direction is taken as an X-axis direction. A direction perpendicular to the Z-axis direction and the X-axis direction is taken as a Y-axis direction.

For example, the first electrode layer 50 has a layer surface parallel to the X-Y plane. For example, the second electrode layer 60 has a layer surface parallel to the X-Y plane.

The first semiconductor layer 10 is provided between the first electrode layer 50 and the second electrode layer 60. The first semiconductor layer 10 has a first conductivity type.

The second semiconductor layer 20 is provided between the first semiconductor layer 10 and the second electrode layer 60. The second semiconductor layer 20 has a second conductivity type. The second conductivity type is a conductivity type different from the first conductivity type.

For example, the first conductivity type is an n-type; and the second conductivity type is a p-type. The first conductivity type may be the p-type; and the second conductivity type may be the n-type. Hereinbelow, the case is described where the first conductivity type is the n-type and the second conductivity type is the p-type.

The light emitting layer 30 is provided between the first semiconductor layer 10 and the second semiconductor layer 20. An example of the configuration of the light emitting layer 30 is described below.

The first intermediate layer 40 is provided between the second semiconductor layer 20 and the second electrode layer 60. The first intermediate layer 40 is transmissive with respect to the light emitted from the light emitting layer 30. The first intermediate layer 40 includes multiple first contact portions 41 and a first non-contact portion 42. Each of the multiple first contact portions 41 is configured to provide electrical contact between the second electrode layer 60 and the second semiconductor layer 20. The first non-contact portion 42 is juxtaposed with the multiple first contact portions 41 in a first plane 40a (in the X-Y plane) perpendicular to the stacking direction (the Z-axis direction). The first plane 40a is, for example, an interface between the first intermediate layer 40 and the second semiconductor layer 20. The first non-contact portion 42 provides a higher electrical resistance between the second electrode layer 60 and the second semiconductor layer 20 than does the first contact portions 41.

Thereby, a semiconductor light emitting device having high luminance at a low voltage can be provided.

In this example, the second electrode layer 60 is provided on a support substrate 70. In the specification of the application, "provided on" includes not only the case of being provided in direct contact but also the case of having another layer inserted therebetween.

The second electrode layer 60 is disposed between the support substrate 70 and the first intermediate layer 40.

A p-side electrode 71 is provided on the lower surface of the support substrate 70. In other words, the support substrate 70 is disposed between the p-side electrode 71 and the second electrode layer 60. The p-side electrode 71 has ohmic contact with the support substrate 70. It is favorable for the support substrate 70 to include a material having high thermal conductivity. The support substrate 70 may include, for example, a semiconductor or a metal. The support substrate 70 may include, for example, silicon. More specifically, the support substrate 70 may include, for example, a p-type silicon substrate and the like.

The second electrode layer 60 has ohmic contact with the support substrate 70. It is favorable for the second electrode layer 60 to include a material having high reflectance with respect to the light emission wavelength of the light emitting layer 30. It is favorable for the second electrode layer 60 to include Au, Ag, and Al or an alloy having a main component of at least one selected from Au, Ag, and Al. For example, a Ag layer is used as the second electrode layer 60. The thickness of the second electrode layer 60 is, for example, about 200 nanometers (nm).

For example, a light-transmissive conductive layer 41a used to form a portion of the first intermediate layer 40 is provided on the second electrode layer 60. The light-transmissive conductive layer 41a may include, for example, ITO (Indium Tin Oxide) and the like. The thickness of the light-transmissive conductive layer 41a is, for example, about 150 nm.

An insulating layer used to form the first non-contact portion 42 is provided in the upper surface of the light-transmissive conductive layer 41a. This insulating layer may include, for example, $SiO_2$ and the like. For example, multiple openings are provided in a dot configuration in this insulating layer; and the light-transmissive conductive layer 41a is exposed at these openings. The light-transmissive conductive layer 41a that is exposed at the openings is used as the multiple first contact portions 41.

Although a portion of the light-transmissive conductive layer 41a is provided between the first non-contact portion 42 and the second electrode layer 60 in this example, the embodiment is not limited thereto. The first non-contact portion 42 may contact the second electrode layer 60. As long as the multiple first contact portions are juxtaposed with the first non-contact portion in the X-Y plane of the first intermediate layer 40, the configuration otherwise is arbitrary.

In the embodiment, the first contact portions 41 may include a semiconductor or a transparent conductive material. The first non-contact portion 42 may include, for example, an insulating material or a semiconductor having a low impurity concentration. For example, as recited above, ITO is used as the first contact portions 41; and $SiO_2$ is used as the first non-contact portion 42.

For example, a p-type GaP layer used to form a p-side contact layer 22 is provided on the first intermediate layer 40. The thickness of the p-side contact layer 22 is, for example, 100 nm. For example, a p-type InAlP layer used to form a second clad layer 21 is provided on the p-side contact layer 22. The p-side contact layer 22 and the second clad layer 21 are included in the second semiconductor layer 20.

The light emitting layer 30 is provided on the second semiconductor layer 20. The light emitting layer 30 may include, for example, an InGaP layer.

An n-type InAlP layer used to form a first clad layer 11 is provided on the light emitting layer 30. Thus, a heterostructure including the second clad layer 21 (the p-type InAlP layer), the light emitting layer 30 (the InGaP layer), and the first clad layer 11 (the n-type InAlP layer) is provided on the p-side contact layer 22.

A current diffusion layer 12 is provided on the first clad layer 11. The current diffusion layer 12 may include, for example, a four-element layer of n-type InGaAlP. The current diffusion layer 12 has an impurity concentration lower than the impurity concentration of the first clad layer 11.

For example, an n-type GaP layer used to form an n-side contact layer 13 is provided on the current diffusion layer 12. The n-side contact layer 13 may include, for example, n-type GaAs and the like.

The first electrode layer 50 is provided on the n-side contact layer 13.

Thus, the first semiconductor layer 10 includes the first clad layer 11 and the current diffusion layer 12. The current diffusion layer 12 is provided between the first clad layer 11 and the first electrode layer 50. The first semiconductor layer 10 may further include the n-side contact layer 13 provided between the current diffusion layer 12 and the first electrode layer 50.

In this example, the peak wavelength of the light emitted from the light emitting layer 30 is, for example, about 635 nm. However, the peak wavelength of the light emitted from the light emitting layer 30 of the embodiment is arbitrary.

An n-side pad electrode 55 is provided on a portion of the first electrode layer 50. The first non-contact portion 42 (e.g., the $SiO_2$ layer) has a portion underlaying the n-side pad electrode 55 as viewed from the stacking direction (the Z-axis direction).

Figure 2:
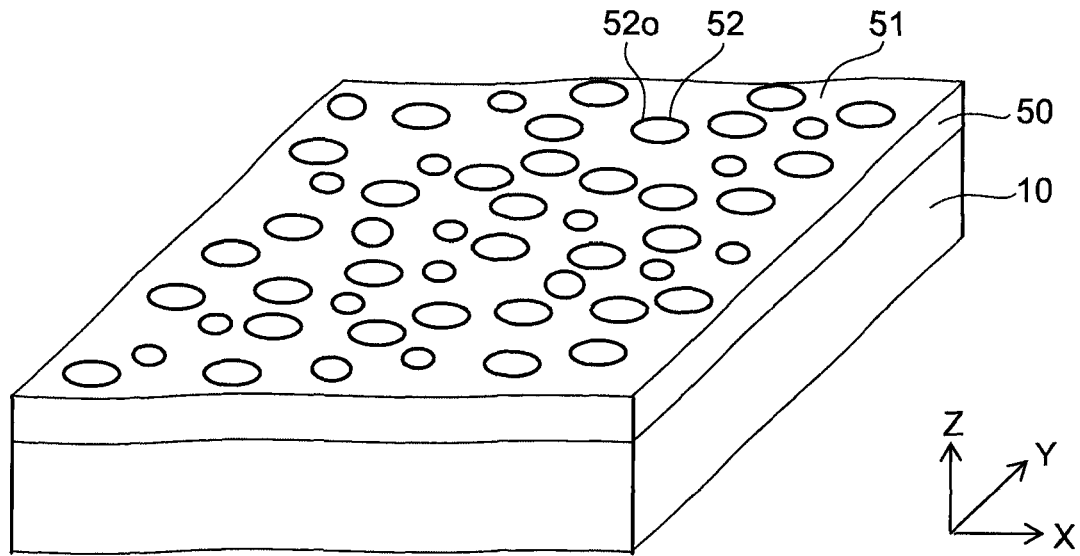
FIG. 2 is a schematic perspective view illustrating a portion of the semiconductor light emitting device according to the first embodiment.

FIG. 2 is a schematic perspective view illustrating the configuration of a portion of the semiconductor light emitting device according to the first embodiment.

As illustrated in FIG. 2, the first electrode layer 50 has the metal portion 51. The multiple through-holes 52 are provided in the metal portion 51. The through-holes 52 pierce the metal portion 51 along the Z-axis direction. The through-holes 52 have openings 52o. The equivalent circular diameter of the opening 52o is not less than 10 nm and not more than 5 micrometers (μm).

The equivalent circular diameter is represented by $2 \times (S/n)^{1/2}$, where S is the surface area of the opening 52o when viewed along the Z-axis direction (herein, n is the circular constant).

In the embodiment, the configuration of the opening 52o when cut by the X-Y plane is arbitrary, e.g., a circle, a flattened circle, a polygon, a polygon having rounded corners, and the like. In the case where the configuration of the opening 52o is not a circle, the opening 52o is specified using the definition of the equivalent circular diameter recited above.

The first electrode layer 50 (the metal portion 51) includes, for example, at least one selected from Ag, Au, Al, Zn, Zr, Si, Ge, Pt, Rh, Ni, Pd, Cu, Sn, C, Mg, Cr, Te, Se, and Ti. By using such a metal as the metal portion 51, an electrical conductivity is obtained that is higher than that of an oxide transparent electrode such as ITO and the like by a factor of 10 to 100 or more. A high thermal conductivity also is obtained in the first electrode layer 50. The through-holes 52 are provided in the metal portion 51 of the first electrode layer 50 with the openings 52o having equivalent circular diameters not less than 10 nm and not more than 5 μm. Thereby, the first electrode layer 50 is light-transmissive. Such a configuration is referred to as a mesh electrode for convenience.

It is favorable for the thickness of the first electrode layer 50 to be, for example, not less than 10 nm and not more than 50 nm. Thereby, a high electrical conductivity and a high optical transmittance are obtained; and good patterning characteristics of the through-holes 52 are obtained.

For example, the sheet resistance of the first electrode layer 50 may be not more than 10 ohm/square. Such a low sheet resistance can be realized using the configuration recited above.

The surface area of the first electrode layer 50 when viewed along the Z-axis direction may be not less than 1 square millimeter (mm²). High electrical conductivity and a high optical transmittance can be obtained even for such a large surface area by using the configuration recited above.

Light is emitted from the light emitting layer 30 by applying a prescribed voltage between the first electrode layer 50 and the second electrode layer 60 (between the n-side pad electrode 55 and the p-side electrode 71). This light is emitted mainly to the outside from the first electrode layer 50 side. In other words, a portion of the light is emitted to the outside via the first semiconductor layer 10 and the first electrode layer 50. Another portion of the light is reflected by the reflective second electrode layer 60 and is emitted to the outside via the second semiconductor layer 20, the light emitting layer 30, the first semiconductor layer 10, and the first electrode layer 50. Thus, in the semiconductor light emitting device 110, the surface where the first electrode layer 50 is formed is utilized as the main light emitting surface.

By providing the multiple first contact portions 41 and the first non-contact portion 42 in the first intermediate layer 40 in the embodiment, the current flowing through the first electrode layer 50 and the second electrode layer 60 is confined.

As illustrated in FIG. 1A, the current flowing through the first electrode layer 50 and the second electrode layer 60 flows through current paths I1 that pass through the multiple first contact portions 41 without passing through the non-contact portion 42. Therefore, the current density increases. High luminance is obtained by the increase of the current density.

Due to the high electrical conductivity of the first electrode layer 50, the current flows by sufficiently spreading in the X-Y plane in the first electrode layer 50; and the current flows along the current paths I1 which are substantially along the Z-axis direction from the first electrode layer 50 toward the second electrode layer 60. For example, it is possible to set the current diffusion layer 12 to be thin because the current can be spread sufficiently uniformly in the X-Y plane by the first electrode layer 50. Thereby, for example, the current density can be increased due to the current confinement effect of the multiple first contact portions 41 without causing negative effects such as the increase of the forward voltage and the like.

Thus, according to the semiconductor light emitting device 110, a semiconductor light emitting device having high luminance at a low voltage can be provided.

Figure 3:
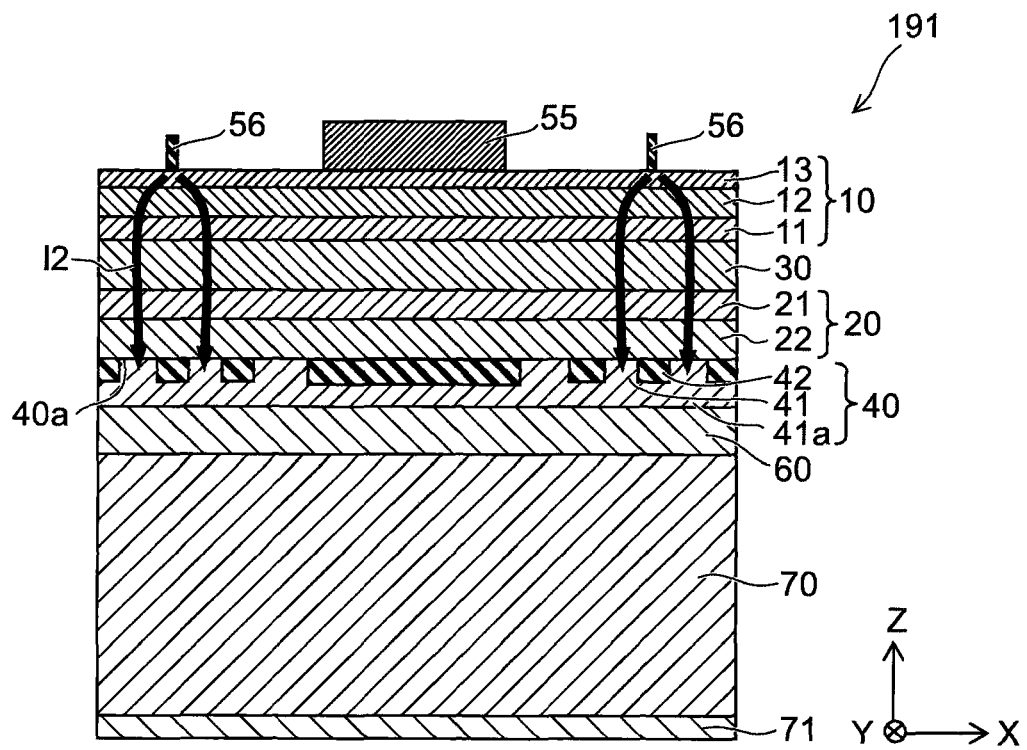
FIG. 3 is a schematic cross-sectional view illustrating a semiconductor light emitting device of a reference example.

FIG. 3 is a schematic cross-sectional view illustrating the configuration of a semiconductor light emitting device of a reference example.

As illustrated in FIG. 3, the first electrode layer 50 (the mesh electrode) is not provided in the semiconductor light emitting device 191 of the first reference example. Thin wire electrodes 56 are provided on the first semiconductor layer 10 (in this example, the n-side contact layer 13). Although not illustrated in FIG. 3, the thin wire electrodes 56 are connected to the n-side pad electrode 55. In this example, the multiple first contact portions 41 do not underlay the thin wire electrodes 56 when viewed along the Z-axis direction.

Further, a semiconductor light emitting device 192 of a second reference example has the configuration illustrated in FIG. 3 without the non-contact portion 42 being provided. In this configuration, the multiple first contact portions 41 having the dot configuration are not provided; and the entire surface of the second semiconductor layer 20 electrically contacts the second electrode layer 60.

In the semiconductor light emitting device 191 of the first reference example having such a configuration, the current is confined as illustrated by current paths I2 by providing the first contact portions 41 in the dot configuration. Thereby, the current density increases more in the semiconductor light emitting device 191 of the first reference example than in the semiconductor light emitting device 192 of the second reference example. Thereby, the efficiency increases. However, a resistance loss occurs in this configuration because the first contact portions 41 are not provided directly under the thin wire electrodes 56. Therefore, the forward voltage undesirably increases.

Figure 4:
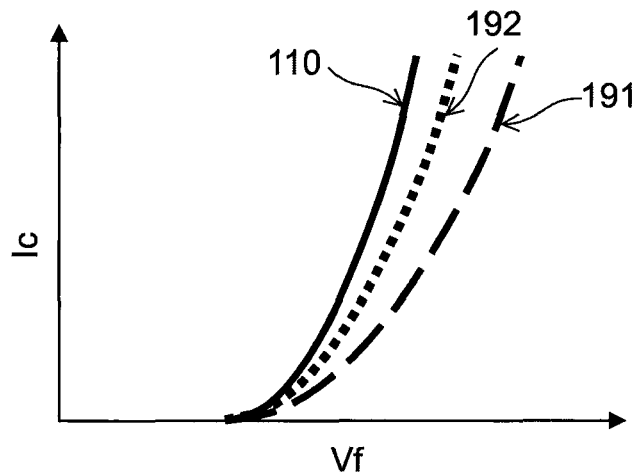
FIG. 4 is a graph illustrating characteristics of the semiconductor light emitting devices.

FIG. 4 is a graph illustrating characteristics of the semiconductor light emitting devices.

FIG. 4 illustrates the characteristics of the semiconductor light emitting device 110 according to the embodiment, the semiconductor light emitting device 191 of the first reference example, and the semiconductor light emitting device 192 of the second reference example. In FIG. 4, the horizontal axis is a forward voltage Vf. The vertical axis is a current Ic.

As illustrated in FIG. 4, the forward voltage Vf increases more for the semiconductor light emitting device 191 than for the semiconductor light emitting device 192. This is because the resistance loss occurs as recited above because the first contact portions 41 are not provided directly under the thin wire electrodes 56.

Conversely, in the semiconductor light emitting device 110 according to the embodiment, the forward voltage Vf does not increase. For example, the forward voltage Vf of the semiconductor light emitting device 110 can be lower than that of the semiconductor light emitting device 192. Then, the effect of the current confinement also increases; the efficiency increases further; and a light emission having high luminance is obtained.

In other words, as described above in regard to FIGS. 1A and 1B, the forward voltage Vf does not increase because the current flows by sufficiently spreading in the X-Y plane in the first electrode layer 50; and the current flows along the current paths I1 in which the current flows substantially along the Z-axis direction.

According to the semiconductor light emitting device 110, a semiconductor light emitting device having high luminance at a low voltage can be provided.

It is possible to increase the current density in the semiconductor light emitting device 110 by suppressing the spread of the current by the sheet resistance of the current diffusion layer 12 being somewhat high, albeit while being affected by the doping concentration of the current diffusion layer 12. Therefore, it is favorable for the thickness of the current diffusion layer 12 on the n side to be not more than 5 µm. It is more favorable for the thickness of the current diffusion layer 12 to be not more than 1 µm because a thinner current diffusion layer 12 reduces the spread of the current further. It is favorable for the thickness of the current diffusion layer 12 to be not less than 10 nm because the current cannot be injected well in the case where the current diffusion layer 12 is too thin.

Thus, in the embodiment, in the case where the first semiconductor layer 10 includes the first clad layer 11 and the current diffusion layer 12, the thickness of the current diffusion layer 12 is set to be, for example, not less than 10 nm and not more than 5 µm. Or, the thickness of the current diffusion layer 12 is set to be, for example, not less than 10 nm and not more than 1 µm. The sheet resistance of the current diffusion layer 12 on the n side may be, for example, not less than $10^2$ ohm/square and not more than $10^6$ ohm/square.

Second Embodiment

Figure 5:
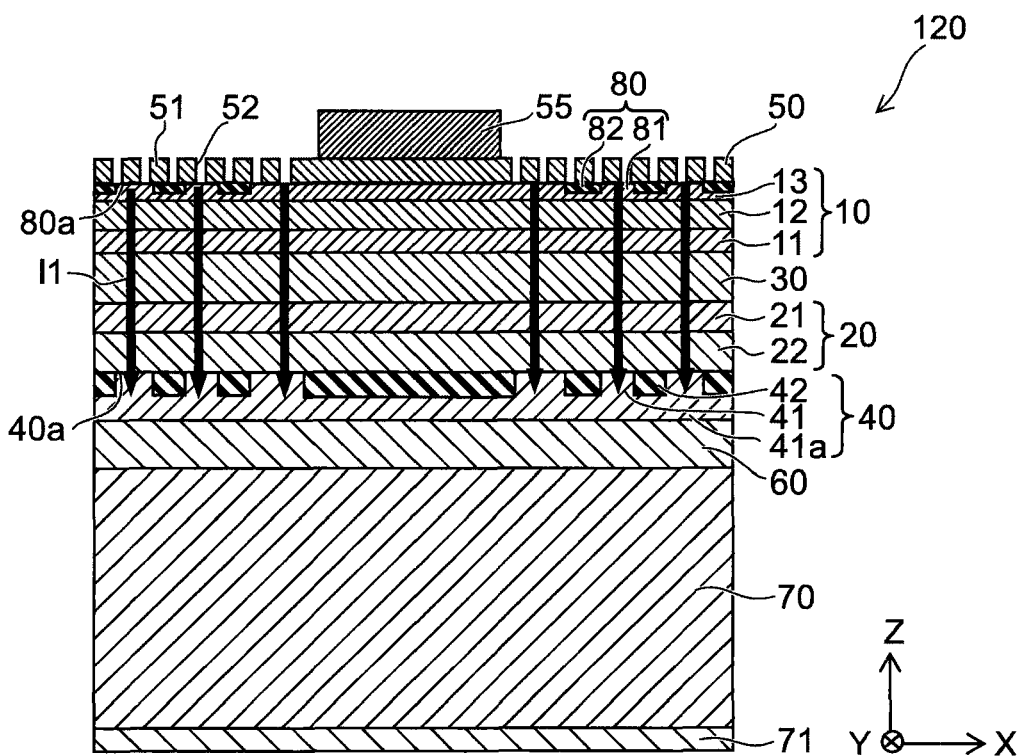
FIG. 5 is a schematic cross-sectional view illustrating a semiconductor light emitting device according to a second embodiment.

FIG. 5 is a schematic cross-sectional view illustrating the configuration of a semiconductor light emitting device according to a second embodiment. FIG. 5 is a cross-sectional view corresponding to the cross section along line A1-A2 of FIG. 1B.

As illustrated in FIG. 5, the semiconductor light emitting device 120 according to the second embodiment further includes a second intermediate layer 80 in addition to the first electrode layer 50, the second electrode layer 60, the first semiconductor layer 10, the second semiconductor layer 20, the light emitting layer 30, and the first intermediate layer 40 described in regard to the first embodiment. Configurations similar to those described above can be applied for the first electrode layer 50, the second electrode layer 60, the first semiconductor layer 10, the second semiconductor layer 20, the light emitting layer 30, and the first intermediate layer 40; and a description is therefore omitted.

The second intermediate layer 80 is provided between the first electrode layer 50 and the first semiconductor layer 10. The second intermediate layer 80 includes a second contact portion 81 and a second non-contact portion 82. The second contact portion 81 has a portion that overlays the multiple first contact portions 41 when the second contact portion 81 is projected onto a plane parallel to the stacking direction (the Z-axis direction). The second contact portion 81 is configured to provide electrical contact between the first semiconductor layer 10 and the first electrode layer 50. The second non-contact portion 82 is juxtaposed with the second contact portion 81 in a second plane 80a (in the X-Y plane) perpendicular to the stacking direction. The second plane 80a is, for example, an interface between the second intermediate layer 80 and the first electrode layer 50. The second non-contact portion 82 provides a higher electrical resistance between the first electrode layer 50 and the first semiconductor layer 10 than does the second contact portion 81.

In other words, in the semiconductor light emitting device 120, the second contact portion 81 of the n side is provided, for example, at a position opposing the first contact portions 41 of the p side. For example, the second contact portion 81 opposes the first contact portions 41 along the Z-axis direction. In the second intermediate layer 80 of the n side, a contact region is provided by the second contact portion 81 above the first contact portions 41; and the region other than the contact region is the second non-contact portion 82 (the non-contact region).

Thereby, the effect of the current confinement increases further. Thereby, a semiconductor light emitting device having higher luminance at a lower low voltage can be obtained.

In the semiconductor light emitting device 120, the sheet resistance of the current diffusion layer 12 can be set to be higher because the current spread of the current diffusion layer 12 on the n side is suppressed. Thereby, the current can be caused to flow substantially linearly along the Z-axis direction; and it is possible to effectively increase the current density. Further, a low forward voltage Vf can be maintained because excessive resistance loss does not occur.

Although the n-side contact layer 13 that is continuous in the X-Y plane is provided in the example illustrated in FIG. 5, the n-side contact layer 13 may be partially provided. For example, a layer used to form the n-side contact layer 13 may be provided partially on the current diffusion layer 12; the n-side contact layer 13 may be used as the second contact portion 81; and the portion where the n-side contact layer 13 is not provided may be used as the second non-contact portion 82. In such a case, for example, the current diffusion layer 12 and the first electrode layer 50 contact each other at the portion other than the n-side contact layer 13 that is partially provided. The resistance of this region is higher than that of the portion where the n-side contact layer 13 is provided; and this region functions as the second non-contact portion 82. For example, the interface portion where the first semiconductor layer 10 and the first electrode layer 50 contact each other is used as the second non-contact portion 82.

In other words, the first semiconductor layer 10 may include: the second contact portion (the n-side contact layer 13 that is partially provided) having a portion overlaying the multiple first contact portions 41 when projected onto a plane parallel to the Z-axis direction; and the second non-contact portion (the portion where the n-side contact layer 13 is not provided) that is juxtaposed with the second contact portion in the X-Y plane and is configured to provide a higher electrical resistance between the first electrode layer 50 and the first semiconductor layer 10 than does the second contact portion.

For example, an insulating layer such as $SiO_2$ may be provided separately from the first semiconductor layer 10 as the second non-contact portion 82.

In the semiconductor light emitting device 120 as well, it is possible to increase the current density by suppressing the spread of the current by the sheet resistance of the current diffusion layer 12 being somewhat high. Therefore, it is favorable for the thickness of the current diffusion layer 12 to be set to be, for example, not less than 10 nm and not more than 5

μm. Or, it is favorable for the thickness of the current diffusion layer 12 to be set to be, for example, not less than 10 nm and not more than 1 μm.

One example of the method for manufacturing the semiconductor light emitting device 120 will now be described as an example of the method for manufacturing the semiconductor light emitting device according to the embodiment.

FIG. 6A to FIG. 6F are schematic views in order of the processes, illustrating the method for manufacturing the semiconductor light emitting device according to the second embodiment.

Figure 6A:
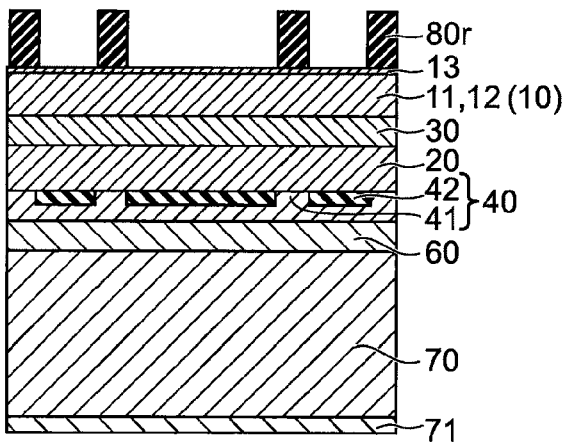
FIG. 6A to FIG. 6F are schematic views in order of the processes, illustrating a method for manufacturing the semiconductor light emitting device according to the second embodiment.

As illustrated in FIG. 6A, a stacked body of the p-side electrode 71, the support substrate 70, the second electrode layer 60, and the first intermediate layer 40 (the light-transmissive conductive layer 41a, the first contact portions 41, and the first non-contact portion 42), the second semiconductor layer 20 (the p-side contact layer 22 and the second clad layer 21), the light emitting layer 30, and the first semiconductor layer 10 (the first clad layer 11, the current diffusion layer 12, and the n-side contact layer 13) is formed. In this example, p-type silicon is used as the support substrate 70, Ag is used as the second electrode layer 60, ITO is used as the light-transmissive conductive layer 41a, ITO is used as the first contact portions 41, SiO$_2$ is used as the first non-contact portion 42, p-type GaP is used as the p-side contact layer 22, p-type InAlP is used as the second clad layer 21, InGaP is used as the light emitting layer 30, n-type InAlP is used as the first clad layer 11, and an n-type InGaAlP layer is used as the current diffusion layer 12. An n-type GaP layer of 10 nm is used as the n-side contact layer.

A resist pattern 80r is formed in a dot configuration by forming, exposing, and developing an i-ray resist film on the n-side contact layer 13 (the n-type GaP layer). At least a portion of this resist pattern having the dot configuration overlays the pattern of the first non-contact portion 42 (the SiO$_2$).

Figure 6B:
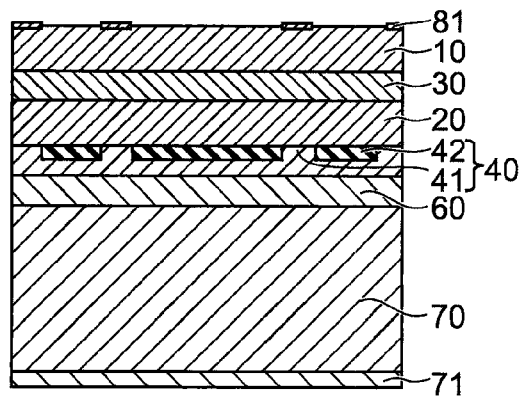

As illustrated in FIG. 6B, the resist pattern 80r is used as a mask; and the portion of the n-side contact layer 13 (the n-type GaP layer) not covered with the resist pattern 80r is removed using an etchant. After the removal, the resist pattern 80r is removed using an organic solvent. Thereby, the second contact portion 81 (the dot pattern of GaP) is formed.

Figure 6C:
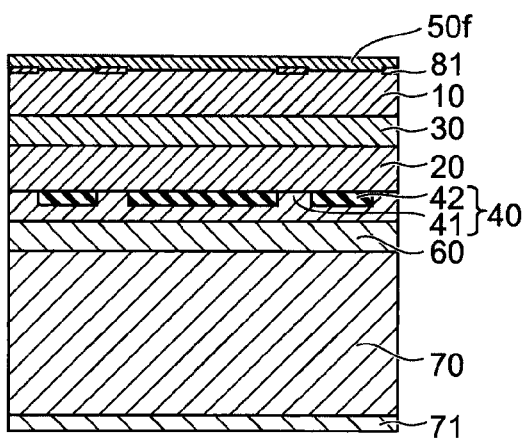

As illustrated in FIG. 6C, a metal film 50f (e.g., a Ag film) used to form the first electrode layer 50 is formed with a thickness of 40 nm on the second contact portion 81 and the first semiconductor layer 10 using vapor deposition. The interface portion where the second contact portion 81 is not provided and the first semiconductor layer 10 and the first electrode layer 50 (the metal film 50f) contact each other is used as the second non-contact portion 82.

Figure 6D:
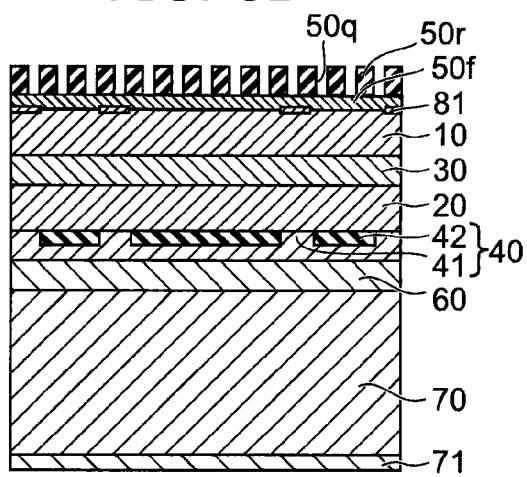

As illustrated in FIG. 6D, an electron beam resist film (e.g., product name FEP-301 made by Fujifilm Corporation) is formed on the metal film 50f (the Ag film) with a thickness of 300 nm. Then, resist opening portions 50q are made in the resist film with opening diameters of 100 nm and a spacing of 200 nm using an electron beam lithography apparatus having a pattern generator and an acceleration voltage of 50 kV. Thereby, a resist layer 50r having the resist opening portions 50q is formed.

Figure 6E:
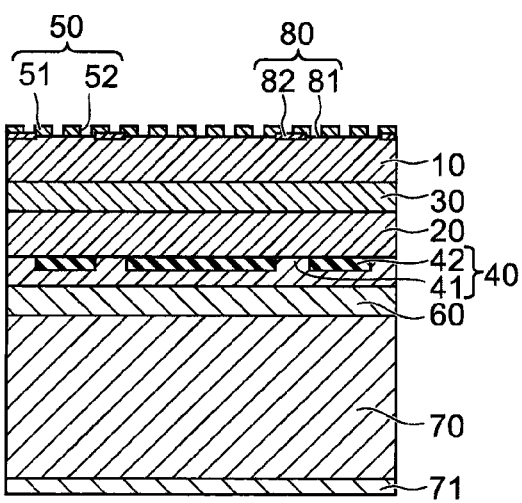

As illustrated in FIG. 6E, etching of the metal film 50f (the Ag film) is performed using an ion milling apparatus with the conditions of an acceleration voltage of 500 volts (V) and an ion current of 40 milliamperes (mA) for 70 seconds. Thereby, the openings 52o (the through-holes 52) are made. Thereby, the metal portion 51, i.e., the first electrode layer 50, having the openings 52o (the through-holes 52) is formed. After the etching, cleaning is performed using an organic solvent to remove the resist layer 50r.

Figure 6F:
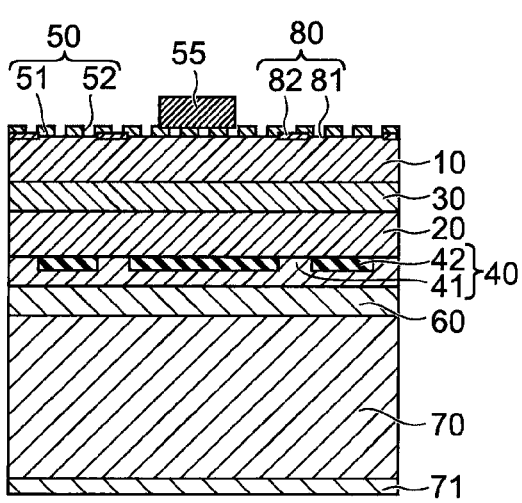

As illustrated in FIG. 6F, the n-side pad electrode 55 is formed. Cutting is performed by dicing. Thereby, the semiconductor light emitting device 120 is obtained. The size of the semiconductor light emitting device 120 is, for example, 300 μm by 300 μm.

The forward voltage Vf when the current value is 50 mA is, for example, about 0.2 V lower for the semiconductor light emitting device 120 than for the semiconductor light emitting device 191.

In the embodiment, the light emitting layer 30 may have, for example, a MQW (Multiple Quantum Well) configuration in which the barrier layers and the well layers are alternately provided repeatedly. The light emitting layer 30 may have a SQW (Single Quantum Well) configuration having one set of a well layer provided between the barrier layers.

The first semiconductor layer 10, the second semiconductor layer 20, and the light emitting layer 30 may include, for example, a nitride semiconductor.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the compositional proportions x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

According to the embodiment, a semiconductor light emitting device having high luminance at a low voltage is provided.

Hereinabove, exemplary embodiments of the invention are described with reference to specific examples. However, embodiments of the invention are not limited to these specific examples. For example, one skilled in the art may similarly practice the invention by appropriately selecting specific configurations of components included in semiconductor light emitting devices such as first electrode layers, second electrode layers, first semiconductor layers, second semiconductor layers, light emitting layers, first intermediate layers, second intermediate layers, support substrates, and the like from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all semiconductor light emitting devices practicable by an appropriate design modification by one skilled in the art based on the semiconductor light emitting devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
a first electrode layer having a metal portion, a plurality of through-holes being provided in the metal portion, each of the through-holes having an opening having an equivalent circular diameter not less than 10 nanometers and not more than 5 micrometers;
a second electrode layer stacked with the first electrode layer along a stacked direction, the second electrode layer being light-reflective;
a first semiconductor layer of a first conductivity type provided between the first electrode layer and the second electrode layer;
a second semiconductor layer of a second conductivity type provided between the first semiconductor layer and the second electrode layer, the second conductivity type being different from the first conductivity type;
a light emitting layer provided between the first semiconductor layer and the second semiconductor layer; and
a first intermediate layer provided between the second semiconductor layer and the second electrode layer, the first intermediate layer being transmissive with respect to light emitted from the light emitting layer,
the first intermediate layer including:
    a plurality of first contact portions to provide electrical contact having a first electrical resistance between the second electrode layer and the second semiconductor layer; and
    a first non-contact portion juxtaposed with the first contact portions in a first plane perpendicular to the stacking direction to provide a second electrical resistance between the second electrode layer and the second semiconductor layer, the second electrical resistance being higher than the first electrical resistance.

2. The device according to claim 1, wherein the first semiconductor layer includes:
a second contact portion having a portion overlaying the first contact portions when projected onto a plane parallel to the stacking direction, the second contact portion providing a third electrical resistance between the first electrode layer and the first semiconductor layer; and
a second non-contact portion juxtaposed with the second contact portion in a second plane perpendicular to the stacking direction to provide a fourth electrical resistance between the first electrode layer and the first semiconductor layer higher than the third electrical resistance.

3. The device according to claim 1, further comprising a second intermediate layer provided between the first electrode layer and the first semiconductor layer,
the second intermediate layer including:
    a second contact portion having a portion overlaying the first contact portions when projected onto a plane parallel to the stacking direction, the second contact portion providing a third electrical resistance between the first electrode layer and the first semiconductor layer; and
    a second non-contact portion juxtaposed with the second contact portion in a second plane perpendicular to the stacking direction to provide a fourth electrical resistance between the first electrode layer and the first semiconductor layer higher than the third electrical resistance.

4. The device according to claim 1, wherein the first semiconductor layer includes:
a first clad layer; and
a current diffusion layer provided between the first clad layer and the first electrode layer, the current diffusion layer having an impurity concentration lower than an impurity concentration of the first clad layer,
a thickness of the current diffusion layer being not less than 10 nanometers and not more than 5 micrometers.

5. The device according to claim 4, wherein the current diffusion layer includes n-type InGaAlP.

6. The device according to claim 4, wherein a sheet resistance of the diffusion current layer is not less than $10^2$ ohm/square and not more than $10^6$ ohm/square.

7. The device according to claim 1, wherein
the first semiconductor layer includes:
a first clad layer; and
a current diffusion layer provided between the first clad layer and the first electrode layer, the current diffusion layer having an impurity concentration lower than an impurity concentration of the first clad layer,
a thickness of the current diffusion layer being not less than 10 nanometers and not more than 1 micrometers.

8. The device according to claim 7, wherein the current diffusion layer includes n-type InGaAlP.

9. The device according to claim 7, wherein a sheet resistance of the diffusion current layer is not less than $10^2$ ohm/square and not more than $10^6$ ohm/square.

10. The device according to claim 1, wherein the first electrode layer includes at least one selected from Ag, Au, Al, Zn, Zr, Si, Ge, Pt, Rh, Ni, Pd, Cu, Sn, C, Mg, Cr, Te, Se, and Ti.

11. The device according to claim 1, wherein a thickness of the first electrode layer is not less than 10 nanometers and not more than 50 nanometers.

12. The device according to claim 1, wherein a surface area of the first electrode layer when viewed along the stacking direction is not less than 1 square millimeter.

13. The device according to claim 1, wherein a sheet resistance of the first electrode layer is not more than 10 ohm/square.

14. The device according to claim 1, wherein the first conductivity type is an n-type, and the second conductivity type is a p-type.

15. The device according to claim 1, wherein the second electrode layer includes at least one of Au, Ag and Al.

16. The device according to claim 1, wherein the first non-contact portion includes silicon oxide.

17. The device according to claim 1, wherein
the first semiconductor layer includes at least one of n-type GaP and n-type InAlP,
the light emitting layer includes InGaP, and
the second semiconductor layer includes at least one of p-type GaP and p-type InAlP.

18. The device according to claim 1, wherein the first semiconductor layer, the second semiconductor layer and the light emitting layer include a nitride semiconductor.

19. The device according to claim 1, further comprising:
a support substrate,
the second electrode layer being provided between the support substrate and the first intermediate layer, and
the second electrode having ohmic contact with the support substrate.

20. The device according to claim 19, wherein the support substrate is a p-type silicon substrate.

* * * * *